(12) United States Patent  (10) Patent No.: US 9,209,392 B1
Sung et al.  (45) Date of Patent: Dec. 8, 2015

(54) RRAM CELL WITH BOTTOM ELECTRODE

(71) Applicant: Taiwan Semiconductor Manufacturing Co., Ltd., Hsin-Chu (TW)

(72) Inventors: Fu-Ting Sung, Yangmei (TW); Chern-Yow Hsu, Chu-Bei (TW); Shih-Chang Liu, Alian Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/513,781

(22) Filed: Oct. 14, 2014

(51) Int. Cl.
*H01L 45/00* (2006.01)
*H01L 27/24* (2006.01)

(52) U.S. Cl.
CPC ........ *H01L 45/1253* (2013.01); *H01L 27/2463* (2013.01); *H01L 45/1233* (2013.01); *H01L 45/1608* (2013.01)

(58) Field of Classification Search
CPC ............ H01L 45/1253; H01L 45/1233; H01L 45/1691
See application file for complete search history.

(56) References Cited

U.S. PATENT DOCUMENTS

| | | | |
|---|---|---|---|
| 7,122,854 B2 | 10/2006 | Fukuzumi | |
| 7,220,599 B2 | 5/2007 | Park et al. | |
| 7,582,889 B2 | 9/2009 | Asano | |
| 7,906,817 B1 | 3/2011 | Wu et al. | |
| 8,241,944 B2 | 8/2012 | Greeley et al. | |
| 8,785,238 B2 | 7/2014 | Kawashima et al. | |
| 2001/0049189 A1* | 12/2001 | Zahorik | 438/638 |
| 2003/0080427 A1 | 5/2003 | Hudgens et al. | |
| 2003/0116794 A1 | 6/2003 | Lowrey | |
| 2005/0127349 A1 | 6/2005 | Horak et al. | |
| 2005/0186768 A1 | 8/2005 | Sugaya et al. | |
| 2006/0012029 A1 | 1/2006 | Kikuchi et al. | |
| 2006/0046379 A1 | 3/2006 | Symanczyk et al. | |
| 2006/0054878 A1 | 3/2006 | Lowrey | |
| 2006/0060909 A1 | 3/2006 | Chi et al. | |

(Continued)

FOREIGN PATENT DOCUMENTS

| | | |
|---|---|---|
| JP | 2006032600 A | 2/2006 |
| KR | 100645064 B1 | 11/2006 |
| WO | 2009154266 A1 | 12/2009 |

OTHER PUBLICATIONS

B.B. Weng, et al.; "ALD HfO2 Based RRAM with Ti Capping"; International Journal of Electrica, Robotics, Electronics and Communications Engineering, vol. 7, No. 9, 2013, p. 1-2.

(Continued)

*Primary Examiner* — Mark Prenty
(74) *Attorney, Agent, or Firm* — Eschweiler & Associates, LLC

(57) ABSTRACT

The present disclosure relates to a resistive random access memory (RRAM) cell having a bottom electrode that provides for efficient switching of the RRAM cell, and an associated method of formation. In some embodiments, the RRAM cell has a bottom electrode surrounded by a spacer and a bottom dielectric layer. The bottom electrode, the spacer, and the bottom dielectric layer are disposed over a lower metal interconnect layer surrounded by a lower interlevel dielectric (ILD) layer. A dielectric data storage layer having a variable resistance is located above the bottom dielectric layer and the bottom electrode, and a top electrode is disposed over the dielectric data storage layer. Placement of the spacer narrows the later formed bottom electrode, thereby improving switch efficiency of the RRAM cell.

20 Claims, 12 Drawing Sheets

(56) References Cited

U.S. PATENT DOCUMENTS

| | | |
|---|---|---|
| 2006/0072370 A1 | 4/2006 | Kuh et al. |
| 2006/0091476 A1 | 5/2006 | Pinnow et al. |
| 2006/0169968 A1 | 8/2006 | Happ |
| 2007/0120580 A1 | 5/2007 | Kim et al. |
| 2007/0158633 A1 | 7/2007 | Lai et al. |
| 2007/0278470 A1 | 12/2007 | Pellizzer et al. |
| 2008/0006851 A1 | 1/2008 | Moriya et al. |
| 2008/0093591 A1 | 4/2008 | Khang et al. |
| 2008/0093592 A1 | 4/2008 | Moriya |
| 2008/0149910 A1 | 6/2008 | An et al. |
| 2008/0247214 A1 | 10/2008 | Ufert |
| 2008/0293224 A1 | 11/2008 | Son et al. |
| 2008/0303015 A1 | 12/2008 | Happ et al. |
| 2009/0148981 A1 | 6/2009 | Lai et al. |
| 2010/0110758 A1 | 5/2010 | Li et al. |
| 2010/0237313 A1 | 9/2010 | Mikawa et al. |
| 2010/0237317 A1 | 9/2010 | Tsunoda |
| 2010/0252796 A1 | 10/2010 | Noshiro |
| 2010/0323491 A1 | 12/2010 | Moniwa et al. |
| 2011/0049460 A1 | 3/2011 | Breitwisch et al. |
| 2011/0096595 A1 | 4/2011 | Terai |
| 2011/0121251 A1 | 5/2011 | Breitwisch et al. |
| 2011/0233696 A1 | 9/2011 | Li |
| 2011/0254126 A1 | 10/2011 | Kreupl et al. |
| 2012/0037875 A1 | 2/2012 | Rolbiecki et al. |
| 2012/0142160 A1 | 6/2012 | Han et al. |
| 2012/0161095 A1 | 6/2012 | Mikawa et al. |
| 2012/0268981 A1 | 10/2012 | Hanzawa et al. |
| 2012/0299063 A1 | 11/2012 | Baba |
| 2013/0001504 A1 | 1/2013 | Ninomiya |
| 2013/0089949 A1 | 4/2013 | Phatak et al. |
| 2013/0099386 A1 | 4/2013 | Lee |
| 2013/0140516 A1 | 6/2013 | Lee et al. |
| 2013/0170291 A1 | 7/2013 | Liu |
| 2013/0187114 A1 | 7/2013 | Kai et al. |
| 2013/0221308 A1 | 8/2013 | Toh et al. |
| 2013/0221310 A1 | 8/2013 | Morikawa et al. |
| 2013/0248795 A1 | 9/2013 | Takahashi et al. |
| 2013/0295745 A1 | 11/2013 | Takahashi et al. |
| 2014/0021584 A1 | 1/2014 | Tu et al. |
| 2014/0034891 A1 | 2/2014 | Wang et al. |
| 2014/0110659 A1 | 4/2014 | Murase et al. |
| 2014/0113430 A1 | 4/2014 | Hayakawa et al. |
| 2014/0124728 A1 | 5/2014 | Kim et al. |
| 2014/0131650 A1 | 5/2014 | Tu et al. |
| 2014/0138600 A1 | 5/2014 | Satoh et al. |
| 2014/0146593 A1 | 5/2014 | Tsai et al. |
| 2014/0151776 A1 | 6/2014 | Beigel et al. |
| 2014/0158964 A1 | 6/2014 | Han et al. |
| 2014/0175366 A1 | 6/2014 | Tu et al. |
| 2014/0179068 A1 | 6/2014 | Samachisa et al. |
| 2014/0203236 A1 | 7/2014 | Chen et al. |
| 2014/0225053 A1 | 8/2014 | Fujii et al. |
| 2014/0227853 A1 | 8/2014 | Matamis et al. |
| 2014/0252297 A1 | 9/2014 | Chang et al. |
| 2014/0264222 A1 | 9/2014 | Yang et al. |
| 2014/0264229 A1 | 9/2014 | Yang et al. |
| 2014/0264233 A1 | 9/2014 | Tu et al. |
| 2014/0284543 A1 | 9/2014 | Ishikawa et al. |
| 2015/0090949 A1 | 4/2015 | Chang et al. |

OTHER PUBLICATIONS

U.S. Appl. No. 14/252,111, filed Apr. 14, 2014.
Non Final Office Action Dated Apr. 10, 2015 U.S. Appl. No. 14/252,111.
Wolf, S. "Silicon Processing for the VLSI Era" vol. 1 copyright 2000 pp. 821.
U.S. Appl. No. 14/041,514, filed Sep. 30, 2013.
Non-Final Office Action dated Nov. 10, 2014 for U.S. Appl. No. 14/041,514.
Notice of Allowance dated Apr. 3, 2015 for U.S. Appl. No. 14/041,514.
Notice of Allowance dated Jun. 30, 2015 for U.S. Appl. No. 14/252,111.

* cited by examiner

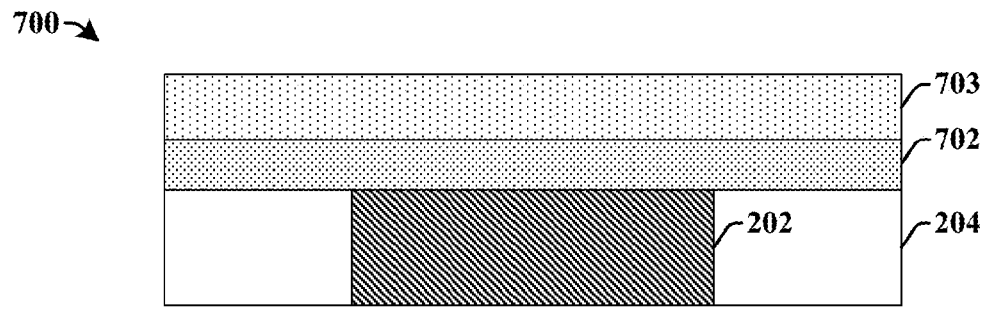
Fig. 7
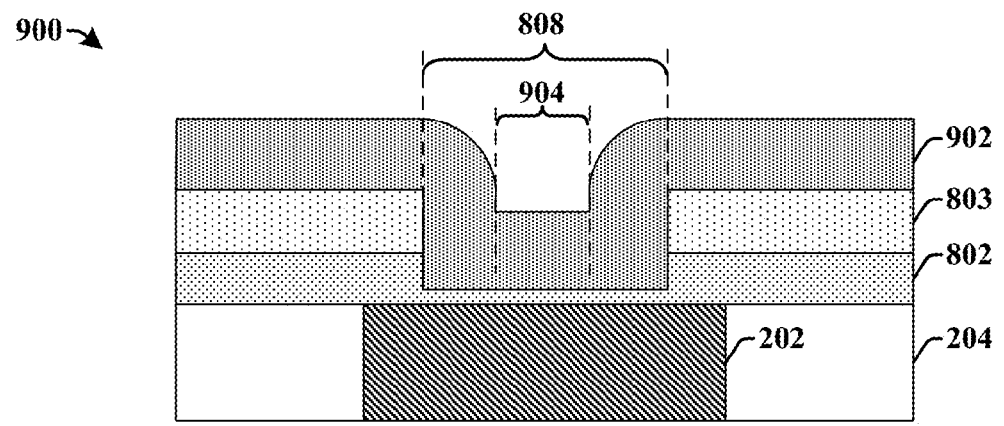
Fig. 8
Fig. 9

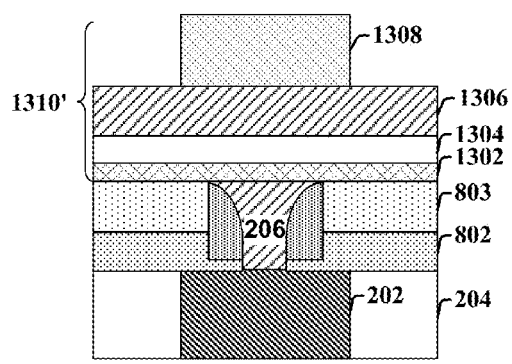 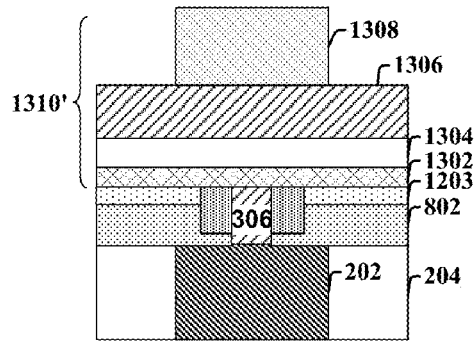
Fig. 13A    Fig. 13B
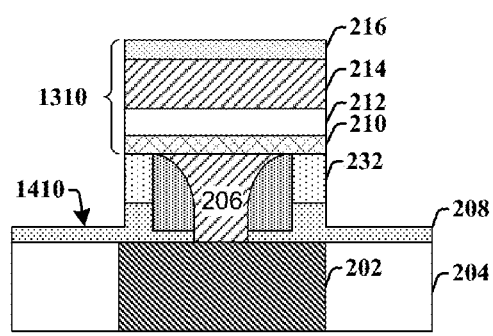 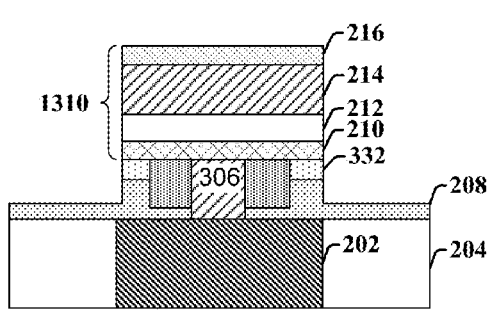
Fig. 14A    Fig. 14B

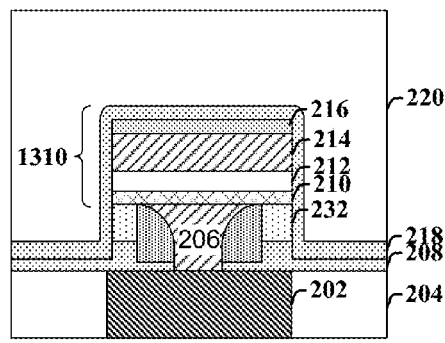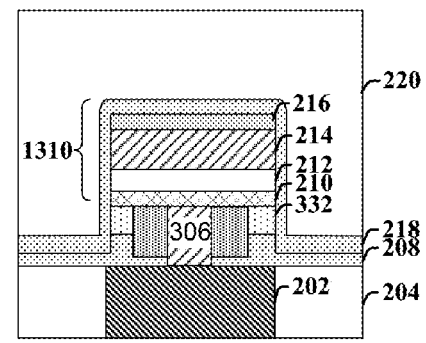
Fig. 15A    Fig. 15B
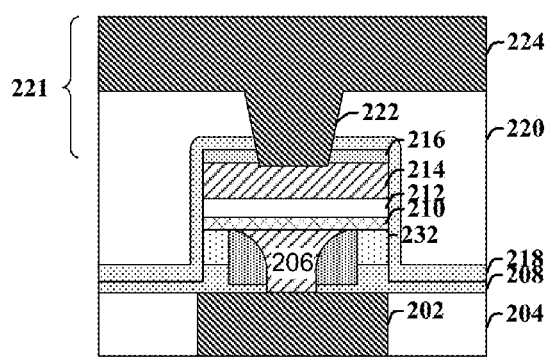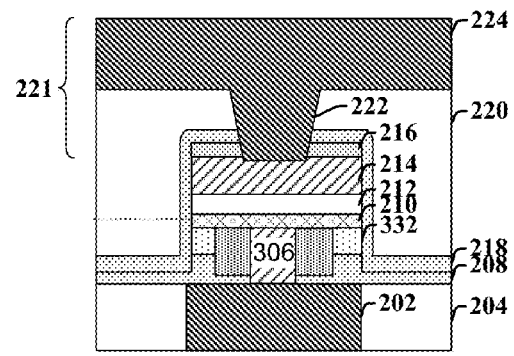
Fig. 16A    Fig. 16B

US 9,209,392 B1

RRAM CELL WITH BOTTOM ELECTRODE

BACKGROUND

Many modern day electronic devices contain electronic memory configured to store data. Electronic memory may be volatile memory or non-volatile memory. Volatile memory stores data while it is powered, while non-volatile memory is able to store data when power is removed. Resistive random access memory (RRAM) is one promising candidate for next generation non-volatile memory technology due to its simple structure and CMOS logic compatible process technology that is involved. An RRAM cell includes a dielectric data storage layer having a variable resistance, which is placed between two electrodes disposed within back-end-of-the-line (BEOL) metallization layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7-25 illustrate cross-sectional views of some alternative embodiments showing a method of forming a RRAM cell having a bottom electrode disposed within a spacer.

DETAILED DESCRIPTION

Figure 1:
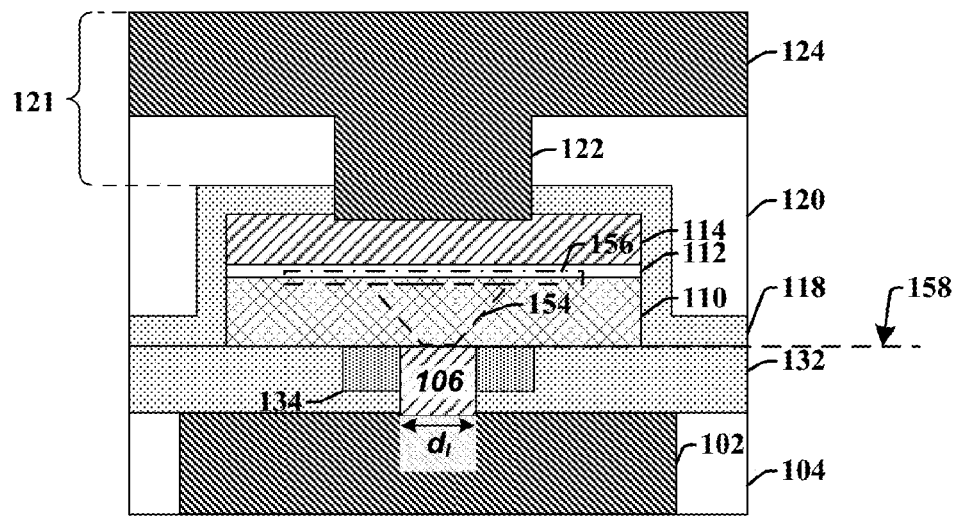
FIG. 1 illustrates a cross-sectional view of some embodiments of resistive random access memory (RRAM) cell having a narrow bottom electrode surrounded by a spacer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Resistive random access memory (RRAM) cells include a dielectric data storage layer placed between two electrodes. Depending on an applied voltage, the dielectric data storage layer will undergo a reversible change between a high resistance state associated with a first data state (e.g., a '0' or 'RESET') and a low resistance state associated with a second data state (e.g., a '1' or 'SET'). The dielectric data storage layer is normally insulating without bias. It can be made to conduct through a filament or conduction path formed after application of a sufficiently high voltage. The filament or conduction path can arise from different mechanism such as oxygen vacancies or metal defect migration. Once the filament is formed, it may be RESET (broken, resulting in high resistance) or SET (re-formed, resulting in lower resistance) by another voltage.

It has been appreciated that the performance of an RRAM cell can be improved by narrowing the bottom electrode. For example, In order to improve switch efficiency and reliability, a triangle filament shape may be used by the disclosed approach to form a relatively narrower bottom electrode. The corresponding narrow end of the filament allows faster and more sensitive set and reset operation.

Accordingly, the present disclosure relates to a resistive random access memory (RRAM) cell having a narrow bottom electrode that provides efficient switching of the RRAM cell, and an associated method of formation. In some embodiments, the RRAM cell comprises a bottom electrode disposed over a lower metal interconnect layer surrounded by a lower inter-level dielectric (ILD) layer. The bottom electrode is surrounded by a spacer and a bottom dielectric layer. In some embodiments, the bottom electrode is formed by forming the spacer within an opening of the bottom dielectric layer and filling a conductive material into the remaining space of the opening. This allows for a width of the bottom electrode to be smaller than the photolithography dimension limitation of an associated manufacturing process. The spacer and the bottom dielectric layer is disposed over the lower metal interconnect layer and/or the lower ILD layer. A dielectric data storage layer having a variable resistance is located above the bottom electrode, the spacer and the bottom dielectric layer, and a top electrode is disposed over the dielectric data storage layer. The narrow bottom electrode induces a filament region with a narrow end, which improves retention and endurance performance of the RRAM cell.

FIG. 1 illustrates a cross-sectional view of a resistive random access memory (RRAM) cell 100 having a bottom electrode 106 surrounded by a spacer 134. The RRAM cell 100 comprises a lower metal interconnect layer 102 surrounded by a lower inter-level dielectric (ILD) layer 104. The bottom electrode 106 and the surrounding spacer 134 are disposed within an opening of a bottom dielectric layer 132 over the lower metal interconnect layer 102 or the lower ILD layer 104. In some embodiments, the bottom dielectric layer 132 surrounds, abuts and extends underneath the spacer 134. In some embodiments, the bottom electrode 106 shares a planar surface 158 with the spacer 134 and the bottom dielectric layer 132. In some embodiments, the bottom dielectric layer 132 comprises dielectric materials such as silicon carbide, silicon nitride, or one or more layers of composite dielectric films. The spacer 134 can comprise a same or different dielectric materials as the bottom dielectric layer 132 such as silicon carbide, silicon nitride, or one or more layers of composite dielectric films. The bottom electrode 106 can comprises titanium (Ti), tantalum (Ta), titanium nitride, tantalum nitride or one or more layers of other metal composite films.

In some embodiments, the bottom electrode 106 may have a relatively small width $d_1$ that is less than a minimum resolvable feature of an associated manufacturing process. The relatively small width $d_1$ improves data retention and endurance performance of the RRAM cell 100. The relatively small width $d_1$ of the bottom electrode 106 is enabled by the spacer 134. For example, an opening can be formed in the bottom dielectric layer 132 to a minimal dimension allowed by a manufacturing process. The spacer 134 can then be inserted within the opening and the bottom electrode 106 can be subsequently formed. This allows for a width $d_1$ of the bottom electrode 106 to be smaller than the photolithography dimension limitation of an associated manufacturing process.

A variable resistance dielectric data storage layer 110, which is configured to store a data state depending on an applied voltage, is located over the bottom electrode 106, the spacer 134, and the bottom dielectric layer 132. A top electrode 114 is disposed over the variable resistance dielectric data storage layer 110. A dashed line 154 show a triangular shape of a filament region comprising one or more conductive filaments (e.g., conductive paths formed from oxygen vacancies) formed within the dielectric data storage layer 110 when a "turn on" voltage is applied.

In some embodiments, a capping layer 112 is disposed between the dielectric data storage layer 110 and the top electrode 114. The capping layer 112 is configured to store oxygen, which can facilitate resistance changes within the dielectric data storage layer 110. In some embodiments, the capping layer 112 may comprise a metal or a metal oxide that is relatively low in oxygen concentration. A dashed-dotted line 156 shows an enhanced region of the filament region induced by the capping layer 112 when the RRAM cell 100 is turned on.

In some embodiments, sidewalls of the dielectric data storage layer 110, the capping layer 112 and the top electrode 114 can be vertically aligned. A top dielectric layer 118 can be disposed over the bottom dielectric layer 132, and continuously extends from an upper surface of the bottom dielectric layer 132, along sidewalls of the dielectric data storage layer 110, the capping layer 112 and the top electrode 114, and to a position overlying a top surface of the top electrode 114. The top dielectric layer 118 separates the top electrode 114 and the variable resistance dielectric data storage layer 110 from an upper inter-level dielectric (ILD) layer 120 surrounding an upper metal interconnect layer 121 having an upper metal via 122 and an upper metal wire 124.

Figure 2:
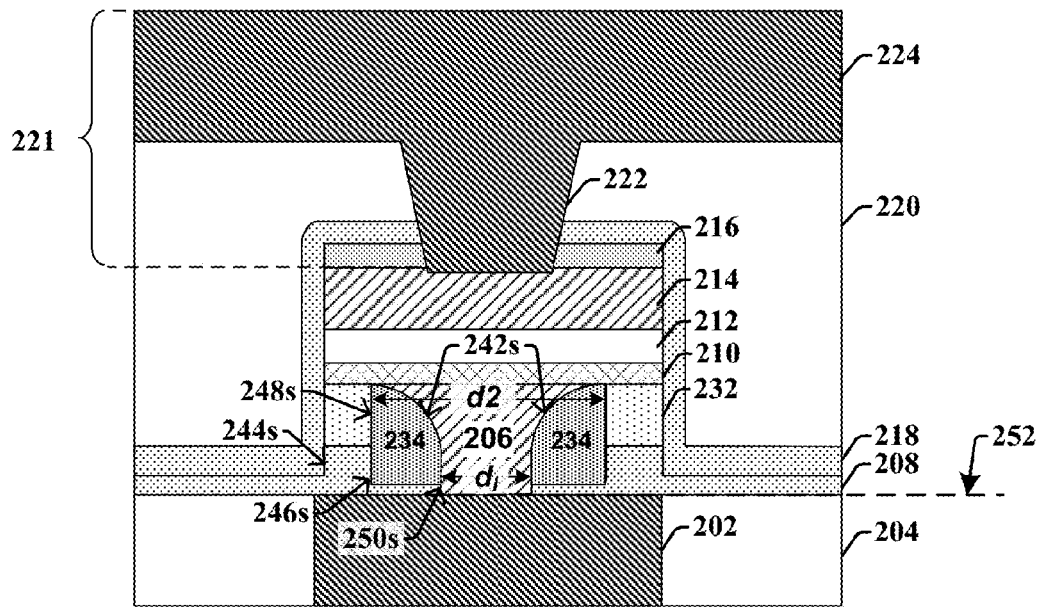
FIG. 2 illustrates a cross-sectional view of some other embodiments of RRAM cell having a bottom electrode surrounded by a spacer.

FIG. 2 illustrates a cross-sectional view of some embodiments of RRAM cell 200 having a bottom electrode 206 surrounded by a spacer 234, a bottom dielectric layer 208, and a buffer dielectric layer 232. In some embodiments, the bottom dielectric layer 208 and the buffer dielectric layer 232 comprise a same or different dielectric material such as silicon carbide (SiC), silicon nitride ($Si_3N_4$), or one or more layers of composite dielectric films. For example, the bottom dielectric layer 208 can comprise silicon carbide and the buffer dielectric layer 232 can comprise silicon nitride. In some embodiments, the bottom electrode 206 comprises non-parallel sidewalls 242s abutting corresponding sidewalls of the spacer 234. A lower portion of the bottom electrode 206 that is closer to a lower metal interconnect layer 202 has a first width $d_1$ that is smaller than a second width d2 of an upper portion of the bottom electrode that is closer to a dielectric data storage layer 210. In some embodiments, the bottom electrode 206 comprises flat top and bottom surfaces connected by way of curved sidewalls 242s. For example, the sidewalls 242s can have a slope that decreases from the lower portion to the upper portion of the bottom electrode 206. The bottom electrode 206 may comprise an inverted tapered upper portion and an underlying cuboid portion having a sidewall abutting the bottom dielectric layer 208 and/or the spacer 234. In some embodiments, d1 is smaller than the photolithography limitation of the manufacturing process. In some embodiments, the bottom electrode 206 shares a planar bottom surface 252 with the bottom dielectric layer 208 and the underlying lower metal interconnect layer 202.

In some embodiments, the bottom dielectric layer 208 can have an outer upper sidewall 244s vertically aligned with sidewalls of the dielectric data storage layer 210 and the top electrode 214. Still, the bottom dielectric layer 208 can have an upper inner sidewall 246s abutting a lower outer sidewall of the spacer 234, and the buffer dielectric layer 232 can have an inner sidewall 248s abutting an upper outer sidewall of the spacer 234. Still, bottom dielectric layer 208 can have a lower inner sidewall 250s aligned with an inner sidewall of the spacer 234.

The bottom electrode 206 of the RRAM cell 200 is disposed onto the lower metal interconnect layer 202, which is surrounded by a lower inter-level dielectric (ILD) layer 204 within a BEOL metallization stack. In some embodiments, the lower metal interconnect layer 202 may comprise one of a plurality of metal interconnect layers disposed between the bottom electrode 206 and an underlying semiconductor substrate (not shown). A top electrode 214 is disposed over a capping layer 212.

In some embodiments, a masking layer 216 (e.g., a hard mask layer) is disposed over the top electrode 214 at positions abutting opposite sidewalls of an upper metal via 222. In some embodiments, the masking layer 216 may comprise a silicon oxy-nitride (SiON) hard mask layer, a silicon dioxide ($SiO_2$) hard mask layer, a silicon carbide (SiC) hard mask layer, a silicon-nitride (SiN) hard mask layer, or a composite dielectric film that is substantially devoid of oxygen.

In some embodiments, a top dielectric layer 218 is disposed onto the masking layer 216. The top dielectric layer 218 continuously extends along sidewalls of the dielectric data storage layer 210, the capping layer 212, the top electrode 214, and the masking layer 216, from a first position abutting a top surface of the masking layer 216 to a second position abutting a top surface of the bottom dielectric layer 208. The top dielectric layer 218 separates the dielectric data storage layer 210, the capping layer 212, the top electrode 214, and the masking layer 216 from an upper inter-level dielectric (ILD) layer 220. The upper ILD layer 220 surrounds an upper metal interconnect layer 221 disposed onto the top electrode 214. The upper metal interconnect layer 221 comprises the upper metal via 222, which extends from the top electrode 214, through the masking layer 216 and the top dielectric layer 218, to an upper metal wire 224.

The top electrode 214, the capping layer 212, and the dielectric data storage layer 210 comprise sidewalls that are vertically aligned with one another. Since the top electrode 214, the capping layer 212 and the dielectric data storage layer 210 extend beyond the narrow bottom electrode 206 on opposing sides, a triangular shape filament region can be formed to improve switch efficiency when the RRAM cell 200 is turned on.

Figure 3:
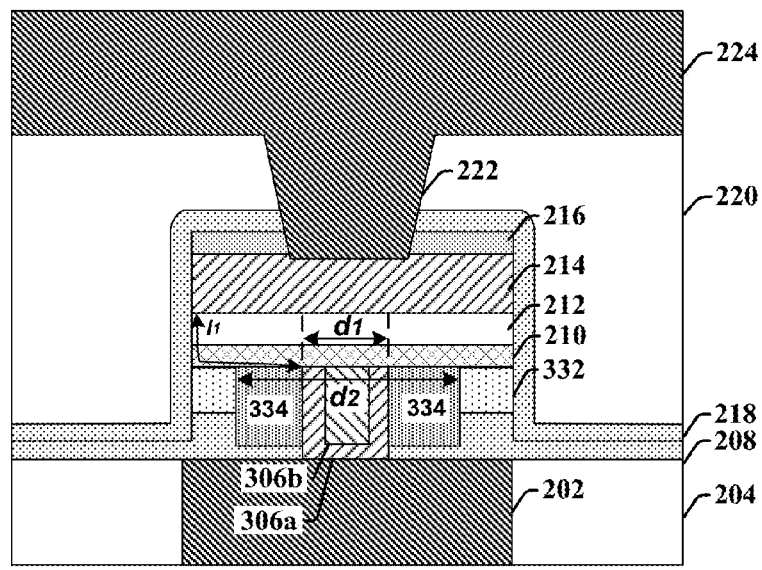
FIG. 3 illustrates a cross-sectional view of some other embodiments of RRAM cell having a bottom electrode surrounded by a spacer.

FIG. 3 illustrates a cross-sectional view of some embodiments of RRAM cell 300 having a bottom electrode 306 surrounded by a spacer 334 and a bottom dielectric layer 208. The bottom electrode 306 is disposed over a lower metal interconnect layer 202 surrounded by lower inter-level dielectric (ILD) layer 204. In some embodiments, the bottom electrode 306 comprises a first bottom electrode layer 306a disposed onto the lower metal interconnect layer 202 comprising a first conductive material, and a second bottom electrode layer 306b nested within the first bottom electrode layer 306a comprising a second conductive material. The first bottom electrode layer 306a and the second bottom electrode layer 306b share a common planar top surface with the spacer 334 and a buffer dielectric layer 332 disposed over the bottom dielectric layer 208. The bottom electrode 306 and the spacer 334 are disposed with the bottom dielectric layer 208, sharing a planar top surface with the bottom dielectric layer 208. Thus a peripheral portion of the dielectric data storage layer 210 is placed onto the bottom dielectric layer 208, increasing a leakage path distance $l_1$ (i.e., a distance through which a leakage current will travel) between the bottom electrode 306 and the top electrode 214, and thereby provides for low leakage current for the RRAM cell 300 without using sidewall spacers that increase the size of the RRAM cell.

Figure 4:
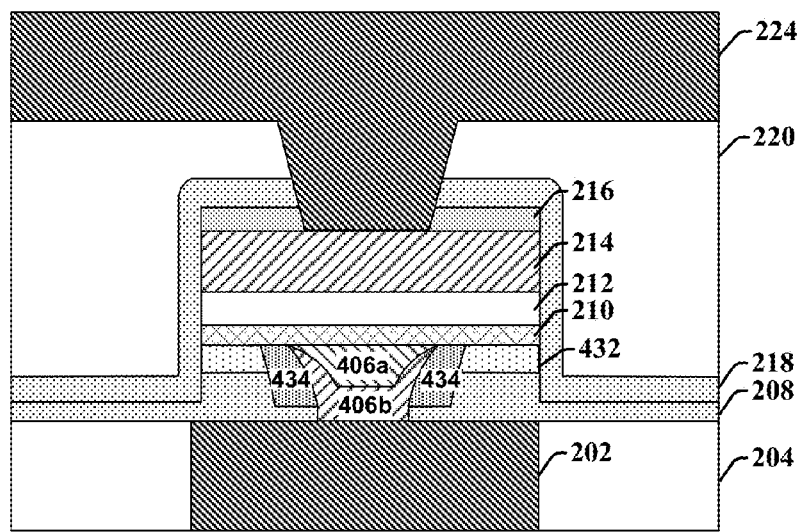
FIG. 4 illustrates a cross-sectional view of some other embodiments of RRAM cell having a bottom electrode surrounded by a spacer.

FIG. 4 illustrates a cross-sectional view of some embodiments of RRAM cell 400 having a bottom electrode 406 surrounded by a spacer 434. The bottom electrode 406 has a flat top surface that is connected to a flat bottom surface by way of curved sidewalls, abutting a corresponding curved inner sidewall of the spacer 434. The spacer 434 further comprises non-parallel outer sidewalls that abut corresponding non-parallel inner sidewalls of surrounding bottom dielectric layer 208 and buffer dielectric layer 432. The bottom electrode 406, the spacer 434, and the buffer dielectric layer 432 share a planar top surface. In some embodiments, the bottom electrode 406 comprises a first bottom electrode layer 406a disposed onto the lower metal interconnect layer 202 comprising a first conductive material, and a second bottom electrode layer 406b nested within the first bottom electrode layer 406a comprising a second conductive material. The first bottom electrode layer 406a shares a common planar top surface with the spacer 434 and the buffer dielectric layer 432 disposed over the bottom dielectric layer 208. The bottom dielectric layer 208 and the overlying buffer dielectric layer 432 comprise an opening that provides for contact between the lower metal interconnect layer 202 and a dielectric data storage layer 210. The spacer 434 is disposed along the curved inner sidewall of the opening and the bottom electrode 406 is disposed within the opening.

Figure 5:
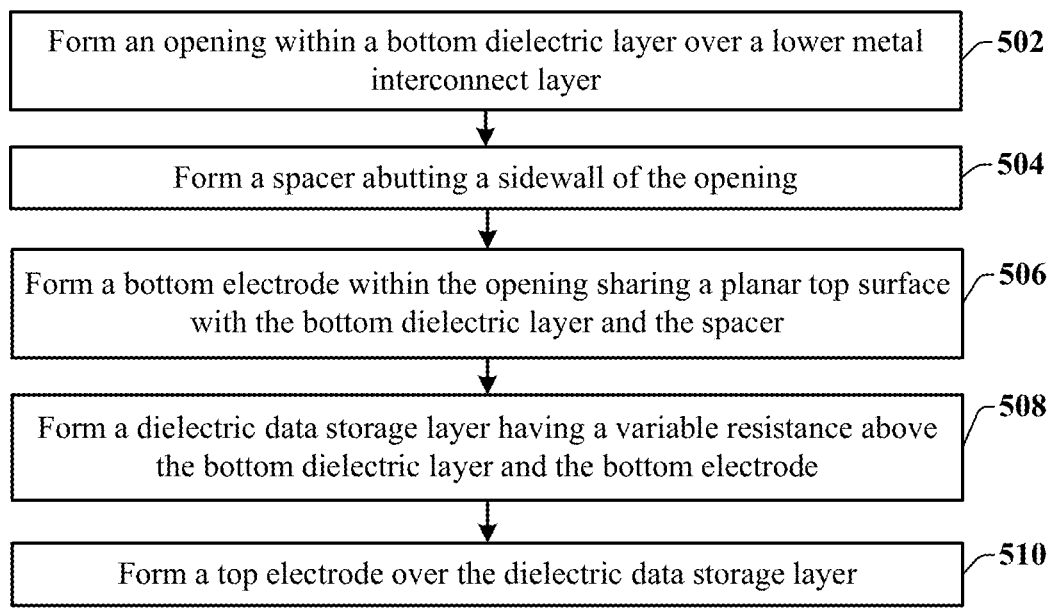
FIG. 5 illustrates a flow diagram of some embodiments of a method of forming a RRAM cell having a bottom electrode surrounded by a spacer.

FIG. 5 illustrates a flow diagram of some embodiments of a method 500 of forming a RRAM cell having a bottom electrode surrounded by a spacer.

At 502, an opening is formed within a bottom dielectric layer over a lower metal interconnect layer.

At 504, a spacer is formed abutting a sidewall of the opening.

At 506, a bottom electrode is formed within the opening sharing a planar top surface with the bottom dielectric layer and the spacer.

At 508, a dielectric data storage layer having a variable resistance is formed above the bottom dielectric layer and the bottom electrode.

At 510, a top electrode is formed over the dielectric data storage layer.

Figure 6:
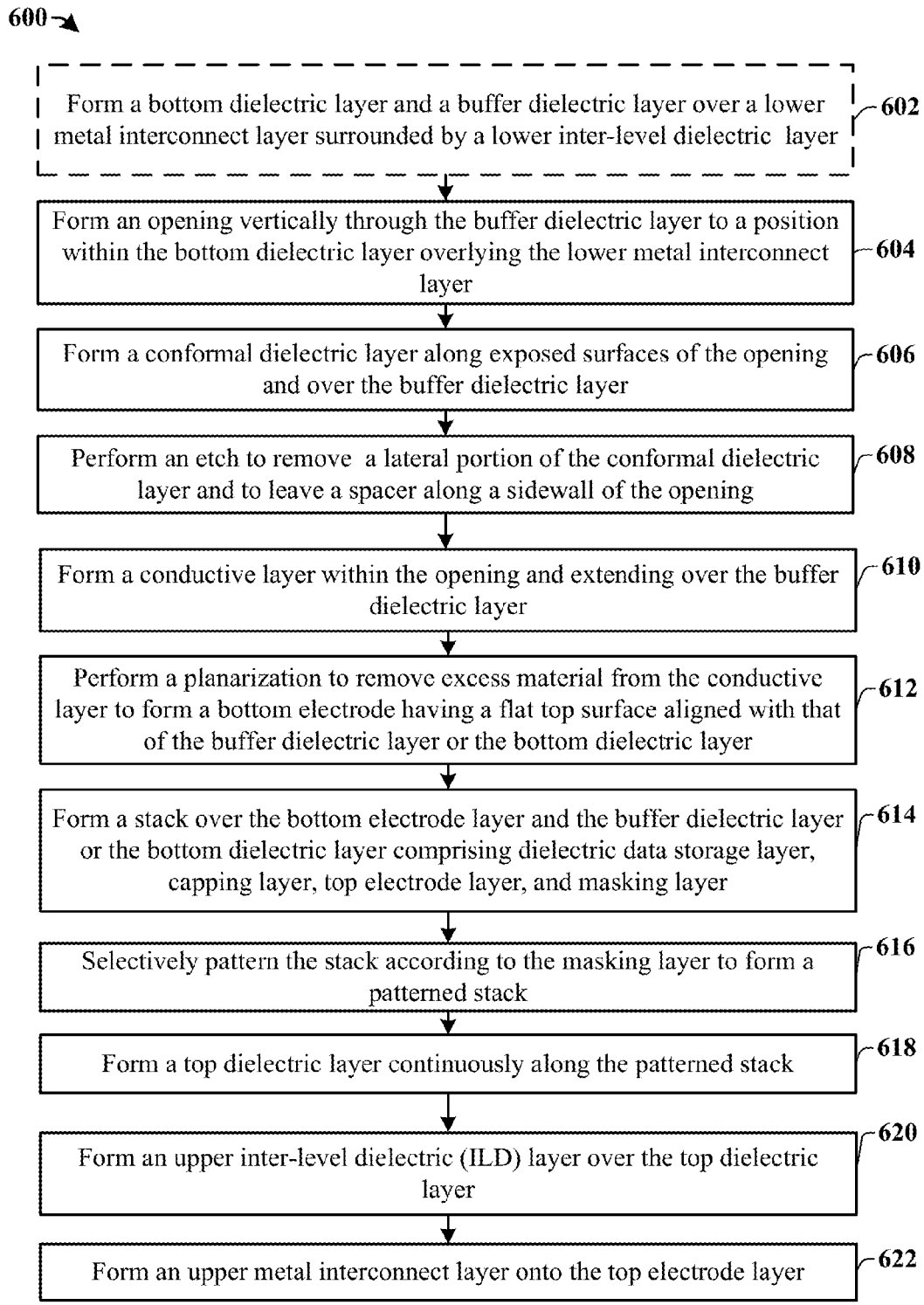
FIG. 6 illustrates a flow diagram of some alternative embodiments of a method of forming a RRAM cell having a bottom electrode disposed within a spacer.

FIG. 6 illustrates a flow diagram of some embodiments of a method 600 of forming a RRAM cell having a bottom electrode disposed within a spacer.

While disclosed methods (e.g., methods 500 and 600) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 602, a bottom dielectric layer is formed over a lower metal interconnect layer surrounded by a lower inter-level dielectric layer. In some embodiments, a buffer dielectric layer comprising a different dielectric material may be formed over the bottom dielectric layer.

At 604, an opening is formed to vertically extend through the buffer dielectric layer to a position within the bottom dielectric layer overlying the lower metal interconnect layer.

At 606, a conformal dielectric layer is formed along exposed surfaces of the opening and over the buffer dielectric layer.

At 608, an etch is performed to remove a lateral portion of the conformal dielectric layer and to leave a spacer along a sidewall of the opening.

At 610, a conductive layer is formed within the opening and extending over the buffer dielectric layer.

At 612, a planarization is performed to remove excess material from the conductive layer to form a bottom electrode having a flat top surface aligned with that of the buffer dielectric layer or the bottom dielectric layer.

At 614, a stack is formed over the bottom electrode layer and the buffer dielectric layer or the bottom dielectric layer comprising dielectric data storage layer, capping layer, top electrode layer, and masking layer.

At 616, the stack is selectively patterned according to the masking layer to form a patterned stack.

At 618, a top dielectric layer is formed continuously along the patterned stack.

At 620, an upper inter-level dielectric (ILD) layer is formed over the top dielectric layer.

At 622, an upper metal interconnect layer is formed onto the top electrode layer.

FIGS. 7-16B illustrate some embodiments of cross-sectional views showing a method of forming a RRAM cell having a bottom electrode surrounded by a spacer disposed within a bottom dielectric layer. Although FIGS. 7-16B are described in relation to method 600, it will be appreciated that the structures disclosed in FIGS. 7-16B are not limited to such a method, but instead may stand alone as structures independent of the method.

FIG. 7 illustrates some embodiments of a cross-sectional view 700 corresponding to acts 602. As shown in cross-sectional view 700, a bottom dielectric layer 702 is formed over a lower metal interconnect layer 202 surrounded by a lower inter-level dielectric layer 204. In some embodiments, the bottom dielectric layer 702 may comprise silicon-nitride (SiN), silicon-carbide (SiC), or a similar composite dielectric film. In some embodiments, the bottom dielectric layer 702 may be formed by a vapor deposition technique (e.g., physical vapor deposition, chemical vapor deposition, etc.). In some embodiments, a buffer dielectric layer 703 made of a different dielectric material can be formed over bottom dielectric layer 702. In some embodiments, the lower metal interconnect layer 202 may be formed by selectively etching the lower ILD layer 204 (e.g., an oxide, a low-k dielectric, or an ultra low-k dielectric) to form an opening in the lower ILD layer 204. A metal (e.g., copper, aluminum, etc.) is then deposited to fill the opening, and a planarization process is performed to remove excess metal to form the lower metal interconnect layer 202.

FIG. 8 illustrates some embodiments of a cross-sectional view 800 corresponding to act 604. As shown in cross-sectional view 800, a first masking layer 804 is formed over the bottom dielectric layer 802 and the buffer dielectric layer 803. The bottom dielectric layer 802 and the buffer dielectric layer 803 are selectively exposed to an etchant 806 (e.g., a dry etchant) in areas not covered by the first masking layer 804. The etchant 806 forms an opening 808 in the bottom dielectric layer 802 and the buffer dielectric layer 803, which extends through the bottom dielectric layer 802 to a lower portion 810 of the buffer dielectric layer 803. For example, a height from a bottom surface of the bottom dielectric layer 802 to the portion 810 can be around 100 Å.

FIG. 9 illustrates some embodiments of a cross-sectional view 900 corresponding to act 606. As shown in cross-sectional view 900, the first masking layer 804 is removed. A conformal dielectric layer 902, acting as a spacer precursor, is formed along exposed surfaces of the opening 808 and over the buffer dielectric layer 803. Since the conformal dielectric layer 902 is formed over opening 808, the conformal dielectric layer 902 has a recess 904 within a top surface having a smaller width than that of opening 808

Figure 10:
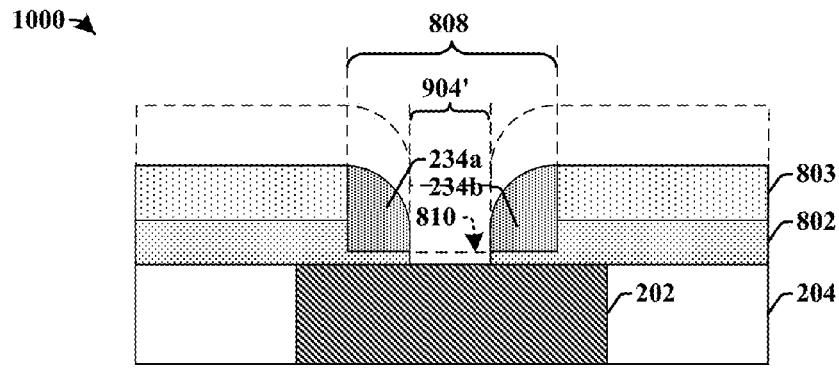

FIG. 10 illustrates some embodiments of a cross-sectional view 1000 corresponding to act 608. As shown in cross-sectional view 1000, an etch (e.g. dry etch) is performed to remove a lateral portion of the conformal dielectric layer 902. The etch exposes top surfaces of the buffer dielectric layer 803, forms an opening 904' that exposes the lower metal interconnect layer 202, and leaves a spacer 234 along a sidewall of the opening 808. A portion 810 of the bottom dielectric layer 802 that is not covered by the spacer 234 or the buffer dielectric layer 803 is removed as well. The buffer dielectric layer 803 can act as an etch stop layer and the removal of the portion 810 of the bottom dielectric layer 802 helps to protect the underlying lower metal interconnect layer 202 from damage during the etch.

Figure 11:
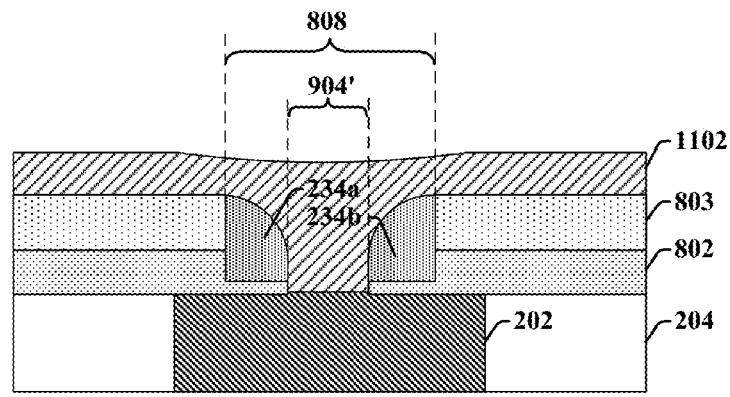

FIG. 11 illustrates some embodiments of a cross-sectional view 1100 corresponding to act 610. As shown in cross-sectional view 1100, a conductive layer 1102 is formed within the opening 904' and to positions extending over the buffer dielectric layer 803.

Figures 12A, 12B:
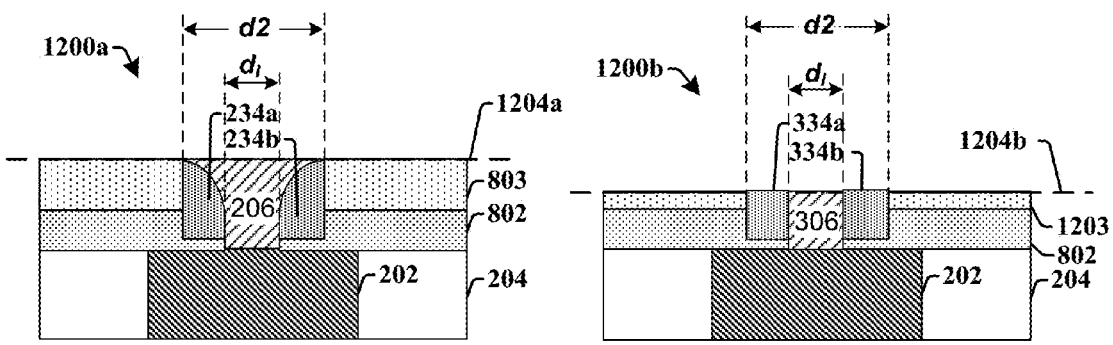

FIGS. 12A and 12B illustrate some embodiments of cross-sectional views 1200a and 1200b corresponding to act 612.

As shown in cross-sectional view 1200a, a planarization process is performed to form a flat surface along line 1204a by removing excess conductive materials from the conductive layer 1102. The planarization process results in a bottom electrode 206 having a flat top surface connected to a flat bottom surface by way of a curved sidewall at a relative upper portion and a vertical sidewall at a relative lower portion of the bottom electrode 206. The flat top surface of the bottom electrode 206 is aligned with a top surface of the buffered dielectric layer 803. The flat bottom surface of the bottom electrode 206 is aligned with top surfaces of the lower metal interconnect layer 202 and/or the lower ILD layer 204. In some embodiments, the planarization process may comprise a chemical mechanical polishing (CMP) process.

As shown in cross-sectional view 1200b, a planarization process is performed to form a flat surface along line 1204b by removing excess conductive material from the conductive layer 1102 and an upper portion of buffer dielectric material and spacer material from the buffer dielectric layer 1203 and the spacer 334. The planarization process results in a bottom electrode 306 having a rectangular shape and a constant width $d_1$ that is smaller than a width $d_2$ of the opening 808. The spacer 334 has a rectangular shape as well. In some embodiments, the planarization process may comprise a chemical mechanical polishing (CMP) process.

FIGS. 13A-13B illustrate some embodiments of cross-sectional views 1300a and 1300b corresponding to act 614. As shown in cross-sectional views 1300a-b, a stack 1310' is formed over the bottom electrode, 206 or 306, and the buffer dielectric layer, 803 or 1203. The stack 1310' comprises a planar dielectric data storage layer 1302, a planar capping layer 1304 overlying the planar dielectric data storage layer 1302, a planar top electrode layer 1306 overlying the planar capping layer 1304, and a planar masking layer 1308 overlying the planar top electrode layer 1306. The planar masking layer 1308 is configured to define a top electrode of the RRAM cell. In some embodiments, the different layers of the stack 1310' may be deposited by way of vapor deposition techniques (e.g., physical vapor deposition, chemical vapor deposition, etc.).

In some embodiments, the planar dielectric data storage layer 1302 may comprise a high-k dielectric material having a variable resistance. For example, in some embodiments, the planar dielectric data storage layer 1302 may comprise hafnium oxide ($HfO_x$), zirconium oxide ($ZrO_x$), aluminum oxide ($AlO_x$), nickel oxide ($NiO_x$), tantalum oxide ($TaO_x$), or titanium oxide ($TiO_x$). In some embodiments, the planar capping layer 1304 may comprise a metal such as titanium (Ti), hafnium (Hf), platinum (Pt), ruthenium (Ru), and/or aluminum (Al). In other embodiments, the planar capping layer 1304 may comprise a metal oxide such as titanium oxide ($TiO_x$), hafnium oxide ($HfO_x$), zirconium oxide ($ZrO_x$), germanium oxide ($GeO_x$), cesium oxide ($CeO_x$). In various embodiments, the planar top electrode layer 1306 may comprise a metal nitride (e.g., titanium nitride (TiN) or tantalum nitride (TaN) or a metal (e.g., titanium (Ti) or tantalum (Ta)). In some embodiments, the planar masking layer 1308 may comprise an oxygen containing hard mask layer, such as silicon-oxide ($SiO_2$) or silicon-oxynitride (SiON). In other embodiments, the planar masking layer 1308 may comprise a hard mask layer that is substantially devoid of oxygen, such as silicon-nitride (SiN) silicon-carbide (SiC), or a composite dielectric film that is substantially devoid of oxygen.

FIGS. 14A-14B illustrate some embodiments of cross-sectional views 1400a-b corresponding to act 616. As shown in cross-sectional views 1400a-b, the stack 1310' is patterned according to the planar masking layer 216. The stack 1310' may be patterned to form a patterned stack 1310 by selectively exposing the stack 1310' to an etchant 1402 in areas not covered by the planar masking layer 216. The patterned stack 1310 has a dielectric data storage layer 210 that abuts top surfaces of the bottom electrode, 206 or 306, and the buffer dielectric layer, 232 or 332. In some embodiments, portions of the buffer dielectric layer 803 and the bottom dielectric layer 802 can be removed. An upper portion of the bottom dielectric layer 802 not covered by the planar masking layer 216 can be removed to a horizontal position 1410. In some embodiments, the etchant 1402 may comprise a dry etchant.

FIGS. 15A-15B illustrate some embodiments of cross-sectional views 1500a-b corresponding to acts 618 and 620. As shown in cross-sectional views 1500a-b, a top dielectric layer 218 is formed over patterned stack 1310. An upper inter-level dielectric (ILD) layer 220 is disposed over the top dielectric layer 218. The top dielectric layer 218 has a first side that abuts the dielectric data storage layer 210, the capping layer 212, the top electrode 214, and the masking layer 216, and a second side that abuts the upper ILD layer 220.

FIGS. 16A-16B illustrate some embodiments of cross-sectional views 1600a-b corresponding to act 622. As shown in cross-sectional views 1600a-b, an upper metal interconnect layer 221 is formed at a position abutting the top electrode 214. In some embodiments, the upper metal interconnect layer 221 comprises an upper metal via 222 and an upper metal wire 224. In some embodiments, the upper metal interconnect layer 221 may be formed by etching the upper ILD layer 220 to form an opening that extends through the top dielectric layer 218 and the masking layer 216 to the top electrode 214. The opening is then filed with a metal to form an upper metal via 222, which extends from a top surface of the top electrode 214 to the upper metal wire 224.

FIGS. 17-25 illustrate some embodiments of cross-sectional views showing a method of forming a RRAM cell having a curved sidewall bottom electrode surrounded by a spacer disposed within a bottom dielectric layer. Although FIGS. 17-25 are described in relation to method 600, it will be appreciated that the structures disclosed in FIGS. 17-25 are not limited to such a method, but instead may stand alone as structures independent of the method.

Figure 17:
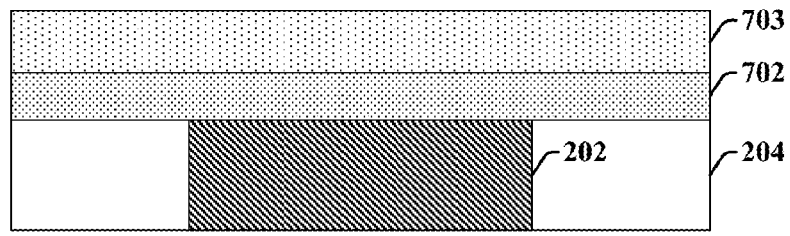

FIG. 17 illustrates some embodiments of a cross-sectional view 1700 corresponding to acts 602. As shown in cross-sectional view 1700, a bottom dielectric layer 702 and a buffer dielectric layer 703 are formed over a lower metal interconnect layer 202 and a lower inter-level dielectric layer 204. In some embodiments, the bottom dielectric layer 702 and the buffer dielectric layer 703 may be formed by a vapor deposition technique (e.g., physical vapor deposition, chemical vapor deposition, etc.).

Figure 18:
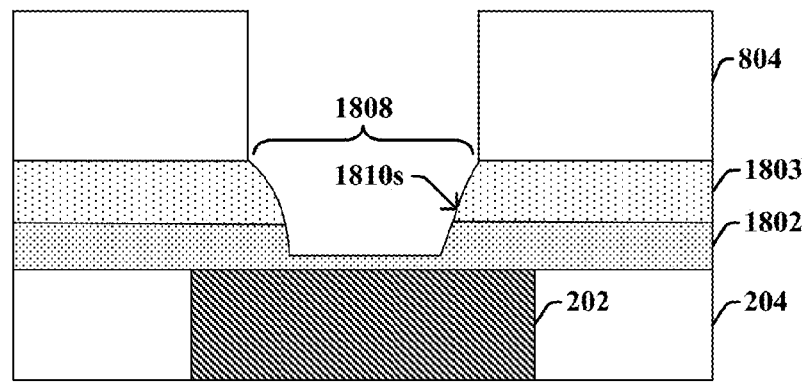

FIG. 18 illustrates some embodiments of a cross-sectional view 1800 corresponding to act 604. As shown in cross-sectional view 1800, a first masking layer 804 is formed over the buffer dielectric layer 803. The bottom dielectric layer 802 and the buffer dielectric layer 803 are selectively exposed to an etchant 1806 (e.g., a dry etchant) in areas not covered by the first masking layer 804. The etchant 1806 forms an opening 1808 with non-parallel sidewalls 1810s, which extends through the bottom dielectric layer 802 to a lower position of the buffer dielectric layer 803. In some embodiments, the opening 1808 may have curved sidewalls. For example, the sidewalls 1810s can have a slope decreases from a lower position of the bottom dielectric layer 1802 to an upper position of the buffer dielectric layer 1803.

Figure 19:
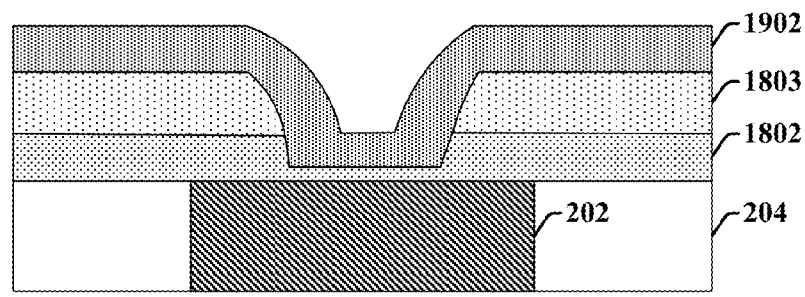

FIG. 19 illustrates some embodiments of a cross-sectional view 1900 corresponding to act 606. As shown in cross-sectional view 1900, the first masking layer 804 is removed. A conformal dielectric layer 1902, acting as a spacer precursor, is formed along exposed surfaces of the opening 1808 and over the buffer dielectric layer 1803.

Figure 20:
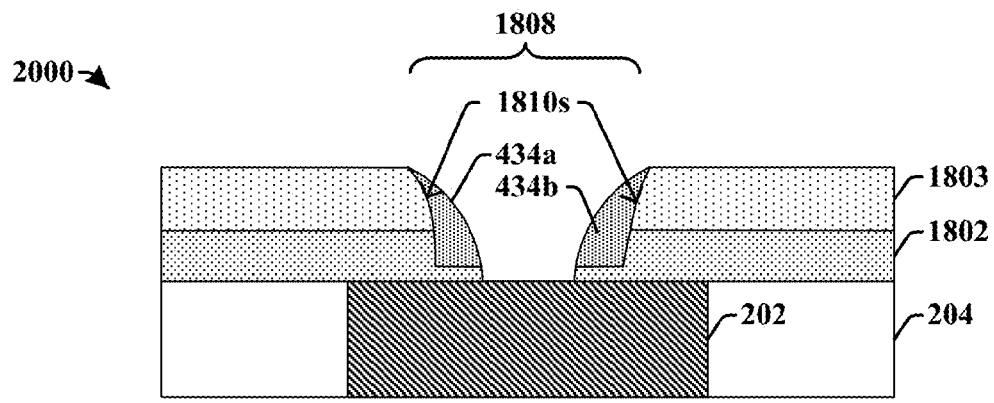

FIG. 20 illustrates some embodiments of a cross-sectional view 2000 corresponding to act 608. As shown in cross-sectional view 2000, an etch (e.g. dry etch) is performed to remove a lateral portion of the conformal dielectric layer 1902, to expose top surfaces of the buffer dielectric layer 1803, and to leave a spacer 434 along the sidewalls 1810s of the opening 1808. A portion of the bottom dielectric layer 1802 that is not covered by the spacer 434 or the buffer dielectric layer 1803 is removed as well. The buffer dielectric layer 1803 can act as a etch stop layer to protect the underlying lower metal interconnect layer 202 from damaging during the etch.

Figure 21:
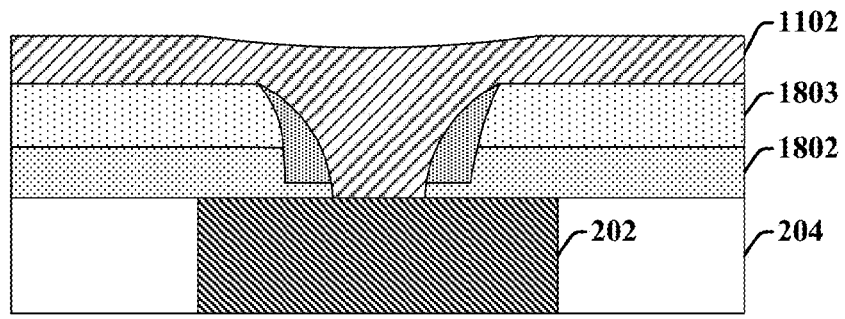

FIG. 21 illustrates some embodiments of a cross-sectional view 2100 corresponding to act 610. As shown in cross-sectional view 2100, a conductive layer 1102 within the opening and extending over the buffer dielectric layer 1803.

Figure 22:
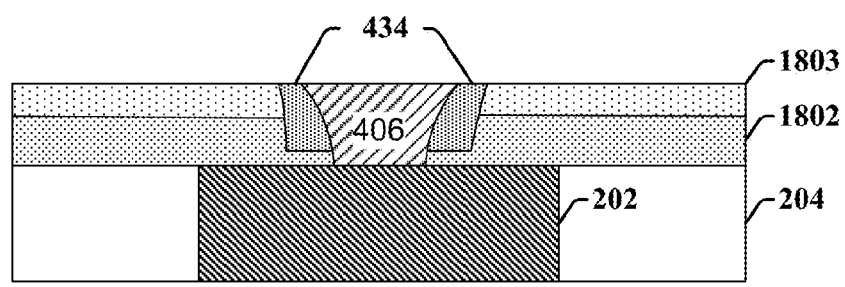

FIG. 22 illustrates some embodiments of a cross-sectional views 2200 corresponding to act 612. As shown in cross-sectional view 2200a, a planarization process is performed to form a flat surface by removing excess conductive materials from the conductive layer 1102 and an upper portion of buffer dielectric material and spacer material from the buffer dielectric layer 1803 and the spacer 434. The planarization process results in a bottom electrode 406 having a curved sidewall and a width deceasing from an upper position to a lower position. The spacer 434 is resulted corresponding curved sidewalls. In some embodiments, the planarization process may comprise a chemical mechanical polishing (CMP) process.

Figure 23:
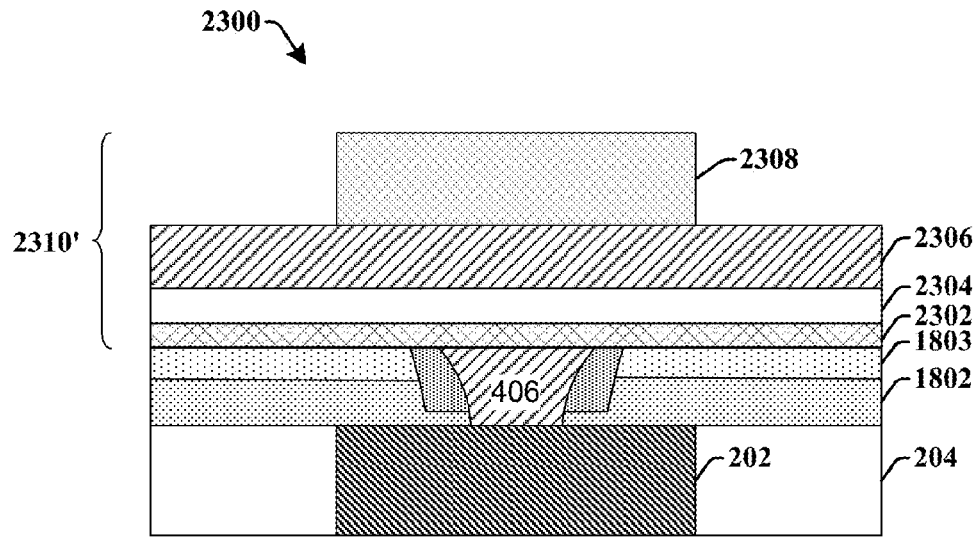

FIG. 23 illustrates some embodiments of a cross-sectional view 2300 corresponding to act 614. As shown in cross-sectional view 2300, a stack 2310' is formed over the bottom electrode 406 and the buffer dielectric layer 1803. The stack 2310' comprises a planar dielectric data storage layer 2302, a planar capping layer 2304 overlying the planar dielectric data storage layer 2302, a planar top electrode layer 2306 overlying the planar capping layer 2304, and a planar masking layer 2308 overlying the planar top electrode layer 2306. The planar masking layer 2308 is configured to define a top electrode of the RRAM cell. In some embodiments, the different layers of the stack 2310' may be deposited by way of vapor deposition techniques (e.g., physical vapor deposition, chemical vapor deposition, etc.).

Figure 24:
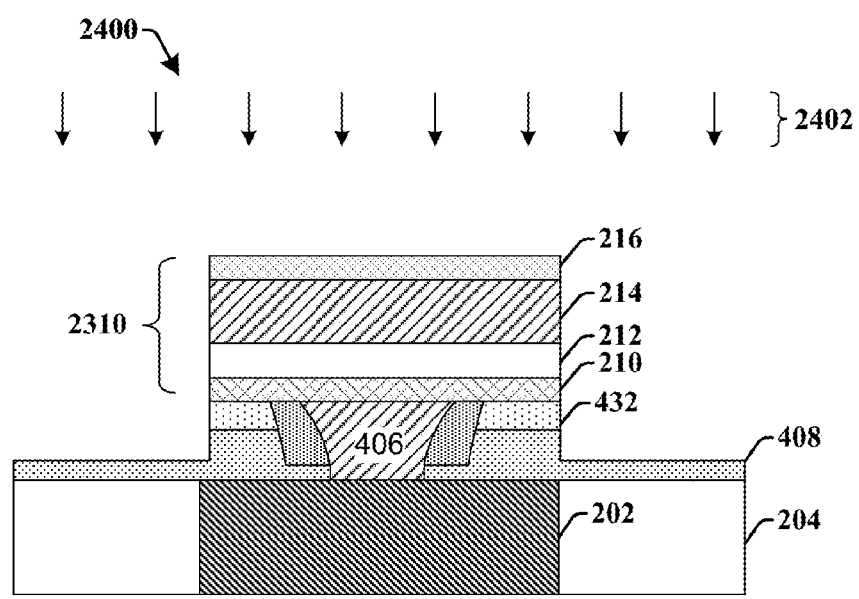

FIG. 24 illustrates some embodiments of a cross-sectional view 2400 corresponding to act 616. As shown in cross-sectional view 2400, the stack 2310' is patterned according to the planar masking layer 216. The stack 2310' may be patterned to form a patterned stack 2310 by selectively exposing the stack 2310' to an etchant 2402 in areas not covered by the planar masking layer 216.

Figure 25:
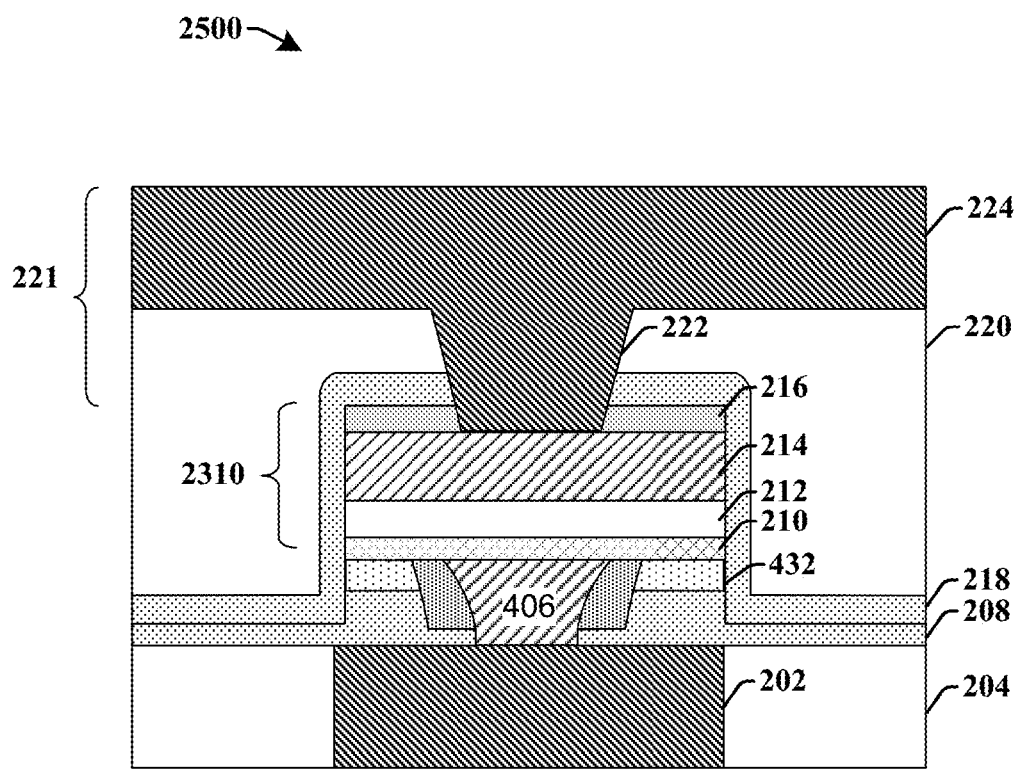

FIG. 25 illustrates some embodiments of a cross-sectional view 2500 corresponding to acts 618, 620 and 622. As shown in cross-sectional view 2500, a top dielectric layer 218 is formed over patterned stack 2310. An upper inter-level dielectric (ILD) layer 220 is disposed over the top dielectric layer 218. An upper metal interconnect layer 221 is formed at a position abutting the top electrode 214. The top dielectric layer 218 has a first side that abuts the dielectric data storage layer 210, the capping layer 212, the top electrode 214, and the masking layer 216, and a second side that abuts the upper ILD layer 220. In some embodiments, the upper metal interconnect layer 221 may be formed by etching the upper ILD layer 220 to form an opening that extends through the top dielectric layer 218 and the masking layer 216 to the top electrode 214. The opening is then filled with a metal to form an upper metal via 222, which extends from a top surface of the top electrode 214 to the upper metal wire 224.

Therefore, the present disclosure relates to a resistive random access memory (RRAM) cell having a bottom electrode surrounded by a spacer that improves RRAM cell switch efficiency, and an associated method of formation.

In some embodiments, the present disclosure relates to a resistive random access memory (RRAM) cell. The RRAM cell comprises a lower metal interconnect layer surrounded by a lower inter-level dielectric (ILD) layer. The RRAM cell further comprises a bottom electrode surrounded by a spacer and a bottom dielectric layer. The spacer and the bottom dielectric layer are disposed over the lower metal interconnect layer or the lower ILD layer. The RRAM cell further comprises a dielectric data storage layer having a variable resistance, disposed over the bottom electrode, the spacer and the bottom dielectric layer. The RRAM cell further comprises a top electrode disposed over the dielectric data storage layer.

In other embodiments, the present disclosure relates to a resistive random access memory (RRAM) cell. The RRAM cell comprises a lower metal interconnect layer surrounded by a lower inter-level dielectric (ILD) layer. The RRAM cell further comprises a bottom electrode disposed over the lower metal interconnect layer or the lower ILD layer, having an upper portion surrounded by a spacer and a lower portion surrounded by a bottom dielectric layer underlying the spacer. The bottom dielectric layer abuts at least a lower portion of a spacer outer sidewall. The RRAM cell further comprises a dielectric data storage layer having a variable resistance, disposed over the bottom electrode and the bottom dielectric layer. The RRAM cell further comprises a capping layer disposed over the dielectric data storage layer, a top electrode disposed over the capping layer, and a top dielectric layer disposed over the lower ILD layer continuously extending along at least a portion of an outer sidewall of the bottom dielectric layer and sidewalls of the dielectric data storage layer, the capping layer and the top electrode and overlying a top surface of the top electrode.

In yet other embodiments, the present disclosure relates to a method of forming a resistive random access memory (RRAM) cell. The method comprises forming an opening within a bottom dielectric layer over a lower metal interconnect layer and forming a spacer abutting sidewalls of the opening. The method further comprises forming a bottom electrode within the opening abutting the spacer. The bottom electrode shares a planar top surface with the bottom dielectric layer. The method further comprises forming a dielectric data storage layer having a variable resistance above the bottom dielectric layer and the bottom electrode. The method further comprises forming a top electrode over the dielectric data storage layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A resistive random access memory (RRAM) cell, comprising:
    a lower metal interconnect layer surrounded by a lower inter-level dielectric (ILD) layer;
    a bottom electrode surrounded by a spacer and a bottom dielectric layer, wherein the spacer and the bottom dielectric layer are disposed over the lower metal interconnect layer or the lower ILD layer;
    a dielectric data storage layer having a variable resistance, disposed over the bottom electrode, the spacer and the bottom dielectric layer; and
    a top electrode disposed over the dielectric data storage layer.

2. The RRAM cell of claim 1, wherein the bottom electrode shares a planar surface with the spacer and the bottom dielectric layer.

3. The RRAM cell of claim 1, further comprising:
    a capping layer disposed between the dielectric data storage layer and the top electrode and having a sidewall that is vertically aligned with sidewalls of the dielectric data storage layer and the top electrode; and
    a top dielectric layer disposed over the bottom dielectric layer continuously extending from an upper surface of the bottom dielectric layer along the sidewalls of the dielectric data storage layer and the top electrode and overlying a top surface of the top electrode, wherein the top dielectric layer abuts the sidewalls of the dielectric data storage layer and the top electrode.

4. The RRAM cell of claim 1, wherein the bottom dielectric layer surrounds, abuts and extends underneath the spacer.

5. The RRAM cell of claim 1, wherein the bottom dielectric layer shares a planar bottom surface with a bottom surface of the bottom electrode and a top surface of the lower metal interconnect layer.

6. The RRAM cell of claim 1, wherein the bottom dielectric layer has an outer upper sidewall vertically aligned with sidewalls of the dielectric data storage layer and the top electrode.

7. The RRAM cell of claim 1, wherein the bottom electrode had a smaller width than the dielectric data storage layer, so that the dielectric data storage layer extends beyond the bottom electrode on opposing sides.

8. The RRAM cell of claim 1, further comprising:
    a buffer dielectric layer vertically disposed between the bottom dielectric layer and the dielectric data storage layer, and disposed laterally surrounding the spacer, and having an inner sidewall abutting an upper outer sidewall of the spacer, wherein the buffer dielectric layer comprise a material that is different from that of the bottom dielectric layer.

9. The RRAM cell of claim 8, wherein a top surface of the bottom electrode shares a planar surface with a top surface of the buffer dielectric layer.

10. The RRAM cell of claim 1, wherein the bottom electrode comprises a cuboid having sidewalls abutting the bottom dielectric layer and the spacer.

11. The RRAM cell of claim 1, wherein the bottom electrode comprises a curved sidewall that abuts a corresponding curved sidewall of the spacer, wherein a first width of a lower portion is smaller than a second width of an upper portion of the bottom electrode.

12. The RRAM cell of claim 11, wherein a slope of the curved sidewall of the bottom electrode is decreasing from a lower position that is closer to the lower metal interconnect layer to a upper position that is closer to the dielectric data storage layer.

13. The RRAM cell of claim 1, wherein the bottom electrode comprises an inverted tapered upper portion having a curved sidewall and a cuboid-shaped lower portion.

14. The RRAM cell of claim 1, wherein the bottom electrode comprises:
    a first bottom electrode layer disposed onto the lower metal interconnect layer, wherein the first bottom electrode layer comprises a first conductive material; and
    a second bottom electrode layer nested within the first bottom electrode layer, wherein the second bottom electrode layer comprises a second conductive material different from the first conductive material;
    wherein the first bottom electrode layer and the second bottom electrode layer have top surfaces that are aligned along a planar surface.

15. A resistive random access memory (RRAM) cell, comprising:
    a lower metal interconnect layer surrounded by a lower inter-level dielectric (ILD) layer;
    a bottom electrode disposed over the lower metal interconnect layer or the lower ILD layer, having an upper portion surrounded by a spacer and a lower portion surrounded by a bottom dielectric layer underlying the spacer, wherein the bottom dielectric layer abuts at least a lower portion of a spacer outer sidewall;

a dielectric data storage layer having a variable resistance, disposed over the bottom electrode and the bottom dielectric layer;

a capping layer disposed over the dielectric data storage layer;

a top electrode disposed over the capping layer; and a top dielectric layer disposed over the lower ILD layer continuously extending along at least a portion of an outer sidewall of the bottom dielectric layer and sidewalls of the dielectric data storage layer, the capping layer and the top electrode and overlying a top surface of the top electrode.

16. The RRAM cell of claim 15, further comprising:
a buffer dielectric layer vertically disposed between the bottom dielectric layer and the dielectric data storage layer, and disposed laterally surrounding the spacer, and having an inner sidewall abutting an upper portion of the spacer outer sidewall, wherein the buffer dielectric layer comprise a material that is different from that of the bottom dielectric layer.

17. The RRAM cell of claim 16, wherein a top surface of the bottom electrode shares a planar surface with top surfaces of the spacer and the buffer dielectric layer.

18. The RRAM cell of claim 15, wherein the bottom dielectric layer surrounds, abuts and extends underneath the spacer.

19. A resistive random access memory (RRAM) cell, comprising:
a lower metal interconnect layer surrounded by a lower inter-level dielectric (ILD) layer;

a bottom dielectric layer disposed over the lower metal interconnect layer and the lower ILD layer a bottom electrode extending through the bottom dielectric layer;

a spacer circumscribing the bottom electrode and having an outer sidewall contacting a sidewall of the bottom dielectric layer;

a dielectric data storage layer having a variable resistance, disposed over the bottom electrode, the spacer and the bottom dielectric layer; and a top electrode disposed over the dielectric data storage layer.

20. The RRAM cell of claim 19, further comprising:
a top dielectric layer disposed over bottom dielectric layer and continuously extending along sidewalls of the dielectric data storage layer and the top electrode and overlying a top surface of the top electrode, wherein the top dielectric layer abuts the sidewalls of the dielectric data storage layer and the top electrode, and the spacer is laterally spaced apart from the top dielectric layer.

* * * * *